(12) United States Patent
Iida et al.

(10) Patent No.: US 8,279,023 B2
(45) Date of Patent: Oct. 2, 2012

(54) FILTER CIRCUIT AND COMMUNICATION DEVICE

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 413 days.

(21) Appl. No.: 12/608,535

(22) Filed: Oct. 29, 2009

(65) Prior Publication Data

US 2010/0156561 A1   Jun. 24, 2010

(30) Foreign Application Priority Data

Dec. 22, 2008   (JP) ................. 2008-326200

(51) Int. Cl.
*H03H 19/00* (2006.01)
*H03H 7/12* (2006.01)
(52) U.S. Cl. ...................... 333/174; 333/167
(58) Field of Classification Search .......... 333/167, 333/174; *H03H 19/00, 7/12*
See application file for complete search history.

(56) References Cited

U.S. PATENT DOCUMENTS 7,965,135 B2 *   6/2011   Yoshizawa et al. .......... 327/554

FOREIGN PATENT DOCUMENTS

| JP | 2008-99224 | 4/2008 |
| JP | 2008-99225 | 4/2008 |
| WO | WO 2008/032635 A1 | 3/2008 |

OTHER PUBLICATIONS

Japanese Office Action issued Dec. 7, 2010, in Patent Application No. 2008-326200.
U.S. Appl. No. 12/614,684, filed Nov. 9, 2009, Iida, et al.
U.S. Appl. No. 12/627,399, filed Nov. 30, 2009, Iida, et al.
S. Manetti, et al., "Switched-Capacitor Lowpass Filter Without Active Components", Electronics Letters, vol. 16, No. 23, Nov. 6, 1980, pp. 883-885.
Atsushi Yoshizawa, et al., "A Gain-Boosted Discrete-Time Charge-Domain FIR LPF with Double-Complementary MOS Parametric Amplifiers", 2008 IEEE International Solid-State Circuits Conference, Feb. 4, 2008, 3 pages.

* cited by examiner

*Primary Examiner* — Robert Pascal
*Assistant Examiner* — Kimberly Glenn
(74) *Attorney, Agent, or Firm* — Oblon, Spivak, McClelland, Maier & Neustadt, L.L.P.

(57) ABSTRACT

There is provided a filter circuit that includes: a flying capacitor which maintains polarity when switching from an input terminal to an output terminal, and the polarity of which is reversed when switching from the output terminal to the input terminal; a first capacitor that is provided in parallel to the flying capacitor, at the input terminal of the flying capacitor; and a second capacitor that is provided in parallel to the flying capacitor, at the output terminal of the flying capacitor. The flying capacitor includes a variable capacity element such that capacity becomes smaller when switching from the input terminal to the output terminal and capacity becomes larger when switching from the output terminal to the input terminal.

6 Claims, 10 Drawing Sheets

FILTER CIRCUIT AND COMMUNICATION DEVICE

BACKGROUND OF THE INVENTION

1. Field of the Invention

The present invention relates to a filter circuit and a communication device.

2. Description of the Related Art

The power supply voltage of a radio frequency (RF) circuit tends to decrease along with miniaturization of a complementary metal oxide semiconductor (CMOS) process. Due to the miniaturization of the CMOS process, if an RF circuit is mounted using a known circuit technique, a voltage margin becomes insufficient and the dynamic range of the signal amplitude is narrowed. Meanwhile, the cut-off frequency of a transistor increases due to the miniaturization of the CMOS process, which is advantageous for operations in which high-speed switching operations are performed at a precise timing. In addition, it is also advantageous that the capacitor ratio becomes accurate due to highly accurate lithography.

A digital RF technology is a new technology that introduces the concept of discrete time signal processing to the RF circuit, in order to avoid the problems that may be caused as a result of the miniaturization of the CMOS process and to obtain the advantages. A charge domain filter is used as a main circuit in the digital RF technology field. The charge domain filter is a filter circuit that is formed by a transconductance amplifier, switches and capacitors. The charge domain filter performs sampling of analog signals by accumulating and discharging electric charges in synchronization with a clock, and performs filtering, decimation and the like using discrete time signal processing.

As a known example of the charge domain filter, there is a charge domain second order infinite impulse response low pass filter (IIR-LPF) such as that described in S. Manetti and A. Liberatore, "Switched-capacitor lowpass filter without active components," Electron. Lett., 1980, 16, pp. 883-885. The charge domain second order IIR-LPF is advantageous in that it can be realized by a simple charge domain circuit. (See also A. Yoshizawa and S. Iida, "A Gain-Boosted Discrete-Time Charge-Domain FIR LPF with Double-Complementary MOS Parametric Amplifiers," Proc. IEEE Int. Solid State Circuits Conf. Dig. Tech. Papers, February 2008).

SUMMARY OF THE INVENTION

However, with the known charge domain second order IIR-LPF described in the above "Switched-capacitor lowpass filter without active components," elements other than the transconductance amplifier are all passive elements and gain is therefore low.

In light of the foregoing, it is desirable to provide a novel and improved filter circuit and communication device that are capable of improving gain with regard to frequency characteristics of a charge domain second order IIR-LPF.

According to an embodiment of the present invention, there is provided a filter circuit including a flying capacitor which maintains polarity when switching from an input terminal to an output terminal, and the polarity of which is reversed when switching from the output terminal to the input terminal, a first capacitor that is provided in parallel with the flying capacitor, at the input terminal of the flying capacitor, and a second capacitor that is provided in parallel with the flying capacitor, at the output terminal of the flying capacitor. The flying capacitor includes a variable capacity element such that capacity becomes smaller when switching from the input terminal to the output terminal and capacity becomes larger when switching from the output terminal to the input terminal.

With the above-described structure, the flying capacitor maintains the polarity when switching from the input terminal to the output terminal, and the polarity of the flying capacitor is reversed when switching from the output terminal to the input terminal. The first capacitor is provided in parallel with the flying capacitor, at the input terminal of the flying capacitor, and the second capacitor is provided in parallel with the flying capacitor, at the output terminal of the flying capacitor. The capacity of the variable capacity element that is provided in the flying capacitor is smaller when switching from the input terminal to the output terminal and is larger when switching from the output terminal to the input terminal. As a consequence, due to the variable capacity element provided in the flying capacitor, gain can be improved with respect to the frequency characteristics of the charge domain second order IIR-LPF.

The first capacitor and the second capacitor may have a different capacity.

According to another embodiment of the present invention, there is provided a communication device including a filter circuit including a flying capacitor which maintains polarity when switching from an input terminal to an output terminal, and the polarity of which is reversed when switching from the output terminal to the input terminal, a first capacitor that is provided in parallel with the flying capacitor, at the input terminal of the flying capacitor, and a second capacitor that is provided in parallel with the flying capacitor, at the output terminal of the flying capacitor. The flying capacitor includes a variable capacity element such that capacity becomes smaller when switching from the input terminal to the output terminal and capacity becomes larger when switching from the output terminal to the input terminal.

According to another embodiment of the present invention, there is provided a filter circuit including at least one variable capacity circuit that has a larger capacity when connected with an input terminal than when connected with an output terminal and that has a smaller capacity when connected with the output terminal than when connected with the input terminal, a first capacitor that is provided in parallel with the variable capacity circuit, at the input terminal of the variable capacity circuit, and a second capacitor that is provided in parallel with the variable capacity circuit, at the output terminal of the variable capacity circuit.

According to the above structure, the polarity of the variable capacity circuit is maintained when switching from the input terminal to the output terminal, and the polarity is reversed when switching from the output terminal to the input terminal. The first capacitor is provided in parallel with the variable capacity circuit at the input terminal of the variable capacity circuit, and the second capacitor is provided in parallel with the variable capacity circuit at the output terminal of the variable capacity circuit. As a result, due to the variable capacity circuit, gain can be improved with respect to the frequency characteristics of the charge domain second order IIR-LPF.

The first capacitor and the second capacitor may have a different capacity.

According to another embodiment of the present invention, there is provided a communication device including a filter circuit including at least one variable capacity circuit that has a larger capacity when connected with an input terminal than when connected with an output terminal and that has a smaller capacity when connected with the output terminal than when connected with the input terminal, a first capacitor that is provided in parallel with the variable capacity circuit, at the input terminal of the variable capacity circuit, and a second capacitor that is provided in parallel with the variable capacity circuit, at the output terminal of the variable capacity circuit.

According to the embodiments of the present invention described above, it is possible to provide a novel and improved filter circuit and communication device capable of improving gain with respect to frequency characteristics of a charge domain second order IIR-LPF.

DETAILED DESCRIPTION OF THE EMBODIMENT(S)

Figure 1:
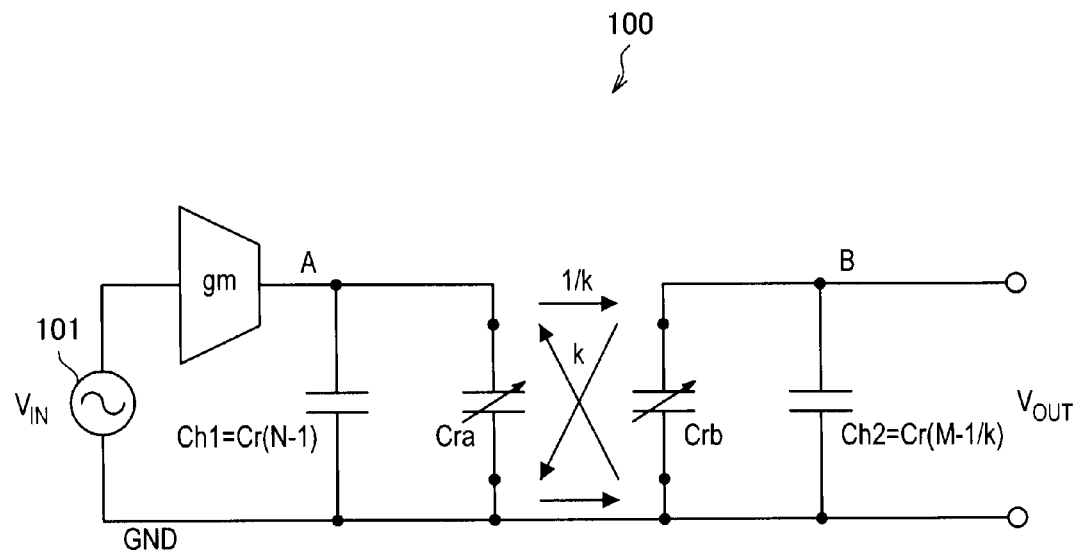
FIG. 1 is an explanatory diagram showing the structure of a charge domain second order infinite impulse response low pass filter (IIR-LPF) 100 according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

An exemplary embodiment of the present invention will be described in detail in the following order.

1. Charge domain second order IIR-LPF according to related art
  1-1. Structure of charge domain second order IIR-LPF according to related art
  1-2. Problems of charge domain second order IIR-LPF according to related art 2. LPF according to embodiment of the present invention
  2-1. Structure of LPF according to embodiment of the present invention
  2-2. Transfer function of LPF according to embodiment of the present invention
  2-3. Frequency characteristics of LPF according to embodiment of the present invention
  2-4. Example of circuit structure of LPF according to embodiment of the present invention 3. Communication device provided with LPF according to embodiment of the present invention 4. Conclusion

1. CHARGE DOMAIN SECOND ORDER IIR-LPF ACCORDING TO RELATED ART

First, before describing the exemplary embodiment of the present invention, a charge domain filter according to related art will be described, and then problems thereof will be described.

1-1. Structure of Charge Domain Second Order IIR-LPF According to Related Art

Figure 10:
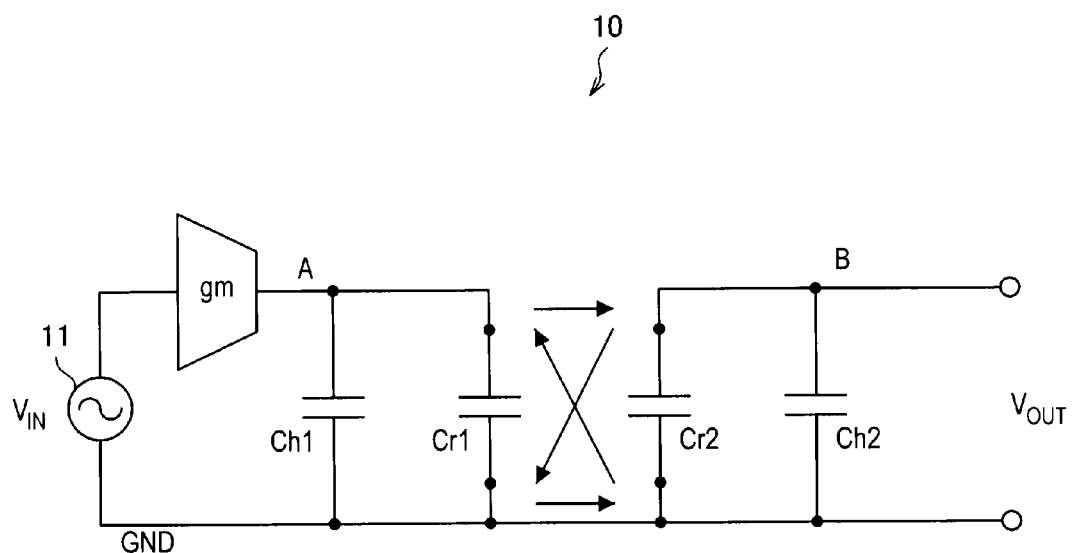
FIG. 10 is an explanatory diagram showing the structure of a charge domain second order IIR-LPF 10 according to related art.

FIG. 10 is an explanatory diagram showing the structure of a charge domain second order IIR-LPF 10 according to the related art, which is described in S. Manetti and A. Liberatore, "Switched-capacitor lowpass filter without active components," Electron. Lett., 1980, 16, pp. 883-885. Hereinafter, the structure of the charge domain second order IIR-LPF 10 according to the related art will be described with reference to FIG. 10.

As shown in FIG. 10, the charge domain second order IIR-LPF 10 according to the related art includes a power source 11, a transconductance amplifier gm, and capacitors Ch1, Ch2, Cr1 and Cr2.

The power source 11 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 10, a current with an amplitude proportional to the input voltage signal $V_{IN}$ from the power source 11, and charges the capacitor Ch1.

The capacitors Cr1 and Cr2 move alternately between an A point side and a B point side in synchronization with a clock input to the LPF 10. Because of the capacitors Cr1 and Cr2 moving alternately between the A point side and the B point side, an electric charge can be transferred and received between the capacitor Ch1 and the capacitor Ch2. As a result, the capacitor Ch2 is charged, a voltage is generated at the B point in FIG. 10, and it is possible to output an output voltage signal $V_{OUT}$.

Figure 11:
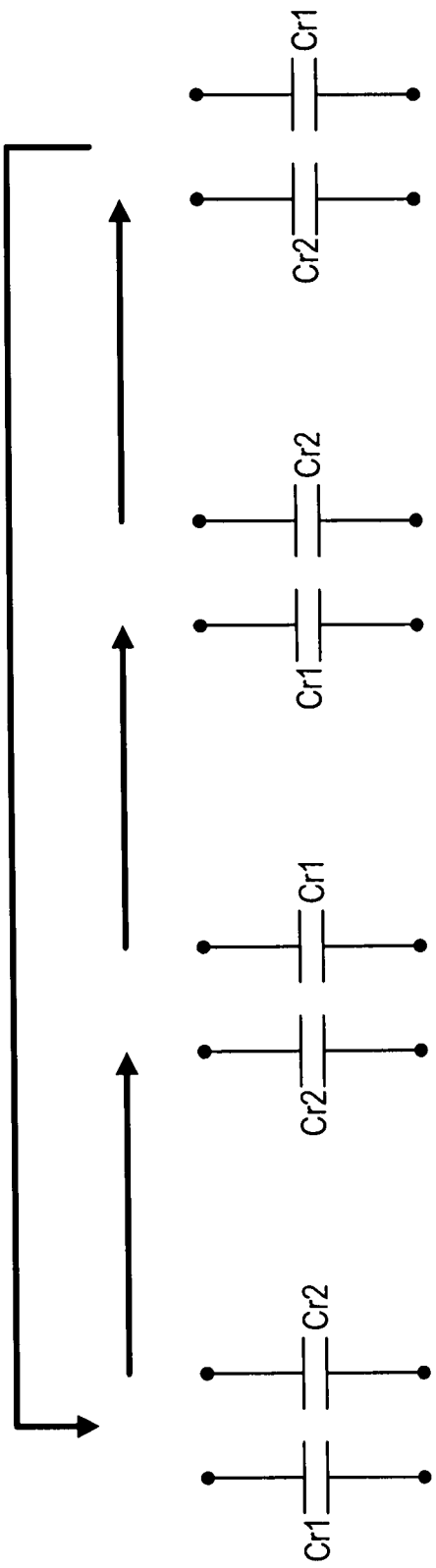
FIG. 11 is an explanatory diagram showing the regularity of movement of the capacitors Cr1 and Cr2 shown in FIG. 10.

Here, the regularity of movement of the capacitors Cr1 and Cr2 will be described with reference to FIG. 11. When the capacitors Cr1 and Cr2 move from the A point side to the B point side in FIG. 10, the capacitors Cr1 and Cr2 move in parallel with each other while maintaining the same polarity. On the other hand, when the capacitors Cr1 and Cr2 move from the B point side to the A point side in FIG. 10, the capacitors Cr1 and Cr2 move while reversing the polarity. FIG. 11 shows a manner in which the capacitors Cr1 and Cr2 move, and the capacitors Cr1 and Cr2 are denoted with positive and negative codes that indicate their respective polarities. For explanatory convenience, (1) in FIG. 11 is referred to as a first state. In the first state, the capacitor Cr1 is located on the A side in FIG. 10, and the capacitor Cr2 is located on the B side in FIG. 10, the capacitors Cr1 and Cr2 both having a positive polarity.

Next, for explanatory convenience, (2) in FIG. 11 is referred to as a second state. In the second state, the capacitor Cr1 has moved such that the B side in FIG. 10 has a positive polarity. Meanwhile, the capacitor Cr2 has moved such that the A side in FIG. 10 has a negative polarity, namely, the polarity is reversed.

Next, for explanatory convenience, (3) in FIG. 11 is referred to as a third state. In the third state, the capacitor Cr2, the polarity of which was reversed in the second state, has moved such that the B side in FIG. 10 has a negative polarity. Meanwhile, the capacitor Cr1 has moved such that the A side in FIG. 10 has a negative polarity, namely, the polarity is reversed.

Next, for explanatory convenience, (4) in FIG. 11 is referred to as a fourth state. In the fourth state, the capacitor Cr1, the polarity of which was reversed in the third state, has moved such that the B side in FIG. 10 has a negative polarity. Meanwhile, the capacitor Cr2 has moved such that the A side in FIG. 10 has a positive polarity, namely, the polarity is reversed.

Then, in a state following the fourth state, the capacitor Cr2 has moved such that the B side in FIG. 10 has a positive polarity. Meanwhile, the capacitor Cr1 has moved such that the A side in FIG. 10 has a positive polarity, namely, the polarity is reversed. This is the same state as the first state. As the first state to the fourth state are repeated in synchronization with the clock in this manner, an electric charge can be transferred and received between the capacitor Ch1 and the capacitor Ch2.

Here, a difference equation is established relating to the electric charge accumulated on each of the A point side and the B point side in FIG. 10, then solved by z transformation to calculate the transfer function of the electric charge. Next, taking into account the transconductance amplifier gm, the capacity of the B point side capacitor, and further the fact that sampling by the clock is performed in a rectangular time window, the voltage transfer function of the LPF 10 shown in FIG. 10 is obtained.

According to S. Manetti and A. Liberatore, "Switched-capacitor lowpass filter without active components," Electron. Lett., 1980, 16, pp. 883-885, the capacity of each of the capacitors Ch1 and Ch2 is equal, respectively, and the capacity of each of the capacitors Cr1 and Cr2 is equal, respectively. Moreover, the capacity of the capacitors Ch1 and Ch2 are both (N−1) times the capacity of the capacitors Cr1 and Cr2. Based on these conditions, if the charge transfer function of the LPF 10 is first calculated, the following Expression 1 is obtained.

$$\frac{Q_B(z)}{Q_i(z)} = \frac{z^{-1}/N}{1 - 2\left(1 - \frac{1}{N}\right)z^{-1} - \left\{\frac{2}{N}\left(1 - \frac{1}{N}\right) - 1\right\}z^{-2}} \quad \text{Expression 1}$$

When one clock time is Ts and the voltage transfer function of the LPF 10 is obtained from the above Expression 1, the following Expression 2 is obtained.

$$\frac{V_{OUT}(f)}{V_{IN}(f)} = \frac{Q_B(\exp(j \cdot 2\pi \cdot f \cdot Ts))}{Q_i(\exp(j \cdot 2\pi \cdot f \cdot Ts))} \cdot \frac{g_m \cdot Ts}{(Ch+Cr)} \cdot \frac{\sin(\pi \cdot f \cdot Ts)}{\pi \cdot f \cdot Ts} \quad \text{Expression 2}$$

Expression 2 will be explained here. The first term on the right hand side is a term in which $\exp(j \cdot 2\pi \cdot f \cdot Ts)$ is substituted for the charge transfer function z shown in Expression 1.

Further, with regard to the numerator of the second term on the right hand side of Expression 2, by multiplying the transconductance gm of the transconductance amplifier gm by the sampling time Ts, the input voltage $V_{IN}$ is converted to the input electric charge $Q_i$ for one sample. In addition, the denominator of the second term on the right hand side of Expression 2 is a sum of the capacity Ch of the capacitor Ch2, and the capacity Cr of the capacitors Ch1 and Cr2. Therefore, the second term on the right hand side of Expression 2 is a term in which the output electric charge $Q_B$ is divided by the sum of the capacity Ch of the capacitor Ch2, and the capacity Cr of the capacitors Ch1 and Cr2 and converted to the output voltage $V_{OUT}$. Then, the third term on the right hand side of Expression 2 is an expression of frequency characteristics of the sinc function arising as a result of the sampling being performed in a rectangular time window.

Figure 12:
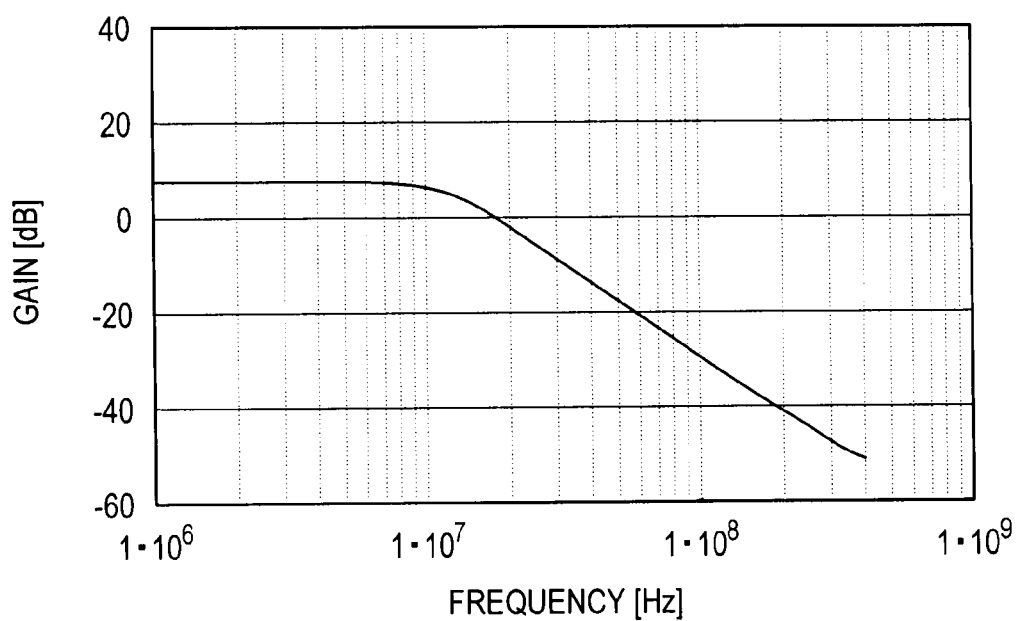
FIG. 12 is an explanatory diagram showing frequency characteristics of the LPF 10, in the form of a graph.

Here, with respect to the LPF 10 shown in FIG. 10, N=20, Ts=1.0 [ns], gm=1.0 [mS], Ch=3.8 [pF] and Cr=0.2 [pF] are set and frequency characteristics are obtained from the above Expression 2. FIG. 12 is an explanatory diagram showing the frequency characteristics of the LPF 10, calculated under the above conditions, in the form of a graph. As shown in FIG. 12, under the above conditions, the frequency characteristics of the LPF 10 are flat to approximately 10 [MHz] in the lower frequency band with approximately 8.0 [dB] gain, and the cut off frequency is approximately 11.5 [MHz]. Furthermore, it can be seen that the frequency characteristics of the LPF 10 in the higher frequency band are second order LPF characteristics that attenuate with an attenuation slope of −40 [dB/dec].

Figure 13:
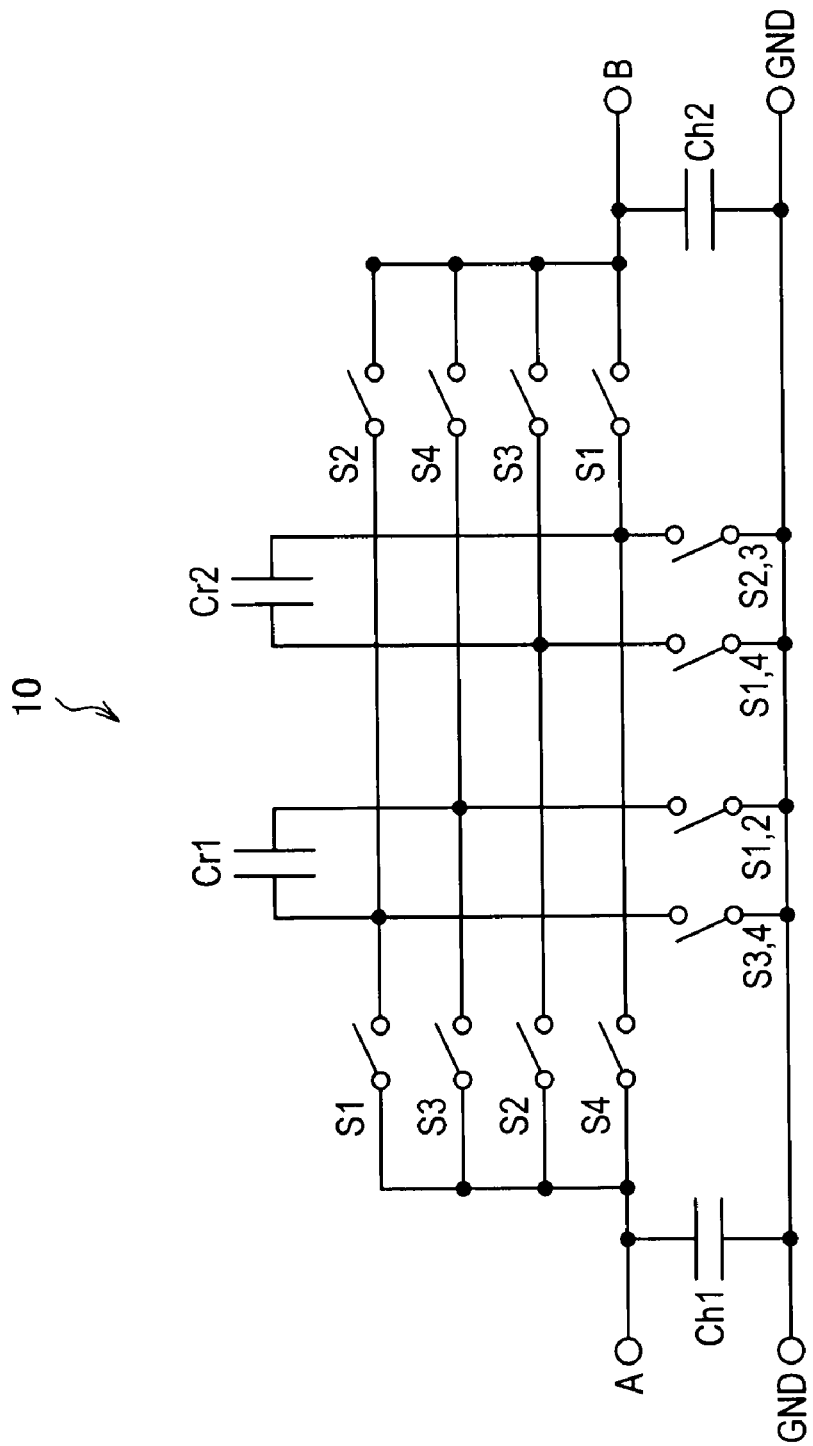
FIG. 13 is an explanatory diagram showing an actual circuit structure of the LPF 10 shown in FIG. 10.
Figure 14:
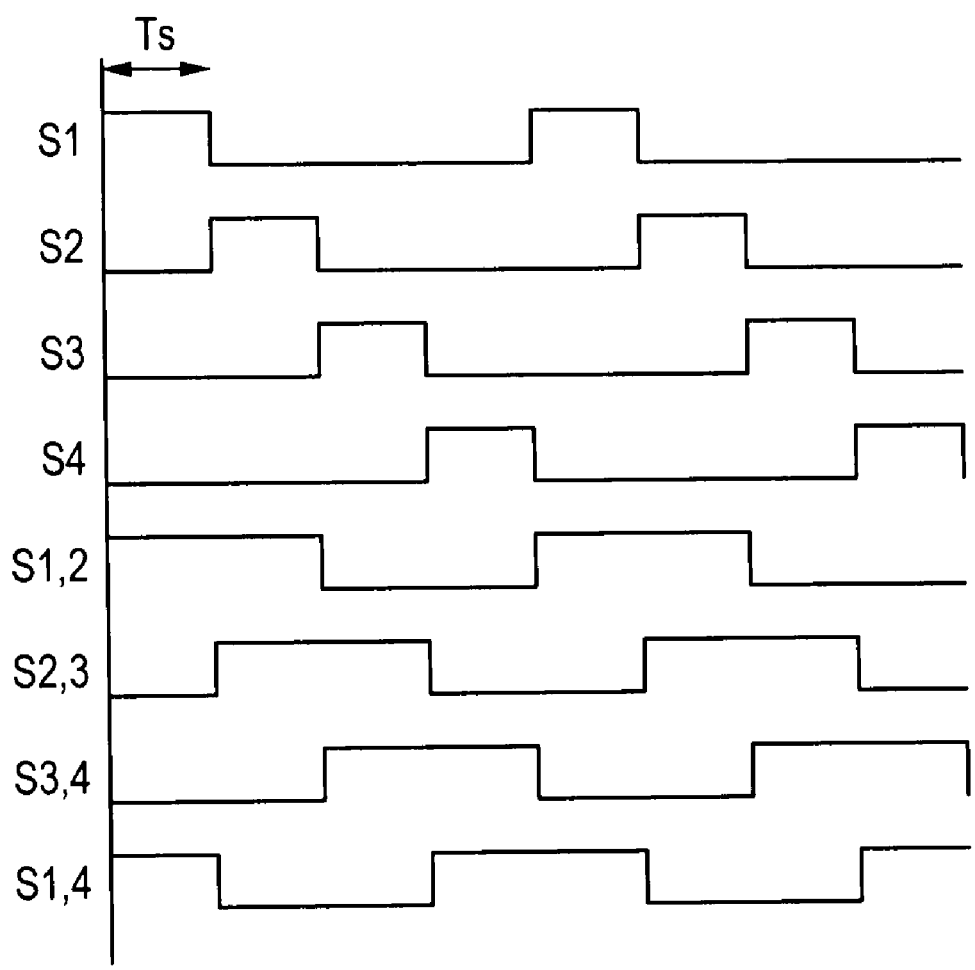
FIG. 14 is an explanatory diagram showing waveforms of clocks input to the LPF 10 shown in FIG. 13.

FIG. 13 is an explanatory diagram showing an actual circuit structure of the LPF 10 shown in FIG. 10. Further, FIG. 14 is an explanatory diagram showing waveforms of clocks input to the LPF 10 shown in FIG. 13. The circuit structure shown in FIG. 13 is obtained by extracting only a capacitor portion from the structure shown in FIG. 10 and illustrating it. Each of the clocks shown in FIG. 14 corresponds to each of the switches shown in FIG. 13. Each of the switches shown in FIG. 13 is turned on when each of the clocks shown in FIG. 14 is in a high level state, and is turned off when each of the clocks shown in FIG. 14 is in a low level state.

An operation of the LPF 10 shown in FIG. 13 will be described. When a clock S1, a clock S1, 2 and a clock S1, 4 are in a high level state, a switch S1, a switch S1, 2 and a switch S1, 4 in FIG. 13 are turned on. When these switches are turned on, the electric charge accumulated in the capacitor Ch1 moves to the capacitor Cr1, and the electric charge accumulated in the capacitor Cr2 moves to the capacitor Ch2.

Then, when a clock S2, the clock S1, 2 and a clock S2, 3 are in a high level state, a switch S2, the switch S1, 2 and a switch S2, 3 in FIG. 13 are turned on. When these switches are turned on, the electric charge accumulated in the capacitor Cr1 moves to the capacitor Ch2. Further, the pole of the capacitor Cr2 that is connected to the ground (GND) is reversed. Then, the electric charge accumulated in the capacitor Ch1 moves to the capacitor Cr2 whose pole has been reversed.

Next, when a clock S3, the clock S2, 3 and a clock S3, 4 are in a high level state, a switch S3, the switch S2, 3 and a switch S3, 4 shown in FIG. 13 are turned on. When these switches are turned on, the electric charge accumulated in the capacitor Cr2 moves to the capacitor Ch2. Further, the pole of the capacitor Cr1 that is connected to the GND is reversed, and the electric charge accumulated in the capacitor Ch1 moves to the capacitor Cr1.

Next, when a clock S4, the clock S3, 4 and a clock S1, 4 are in a high level state, a switch S4, the switch S3, 4 and a switch S1, 4 shown in FIG. 13 are turned on. When these switches are turned on, the electric charge accumulated in the capacitor Cr1 moves to the capacitor Ch2. Further, the pole of the capacitor Cr2 that is connected to the GND is reversed, and the electric charge accumulated in the capacitor Ch1 moves to the capacitor Cr2.

If turning on and off of the switches is repeated in response to the switching of high and low levels of the clocks in this manner, the electric charge accumulated in the capacitor Ch1 moves to the capacitor Ch2 via the capacitors Cr1 and Cr2. As a result, the LPF 10 operates as a low pass filter that has the frequency pass characteristics shown in FIG. 13. The operation in which electric charge moves while the polarities at both ends of the capacitors Cr1 and Cr2 are switched as shown in FIG. 13 is generally called a flying capacitor method.

1-2. Problems of Charge Domain Second Order IIR-LPF According to Related Art

As described above, the charge domain second order IIR-LPF 10 according to the related art disclosed in S. Manetti and A. Liberatore, "Switched-capacitor lowpass filter without active components," Electron. Lett., 1980, 16, pp. 883-885 has an advantage that a second order IIR-LPF can be realized with a simple charge domain circuit. However, as described above, as all the elements of the charge domain second order IIR-LPF according to the related art as disclosed in S. Manetti and A. Liberatore, "Switched-capacitor lowpass filter without active components" are passive elements, apart from the transconductance amplifier, gain is low. Furthermore, as the charge domain second order IIR-LPF 10 according to the related art is formed with a single-phase circuit, if it is used within an IC, it is susceptible to common mode noise. Moreover, as the charge domain second order IIR-LPF 10 according to the related art uses the so-called flying capacitor method, the number of switches increases and the number of clocks used to turn the switches on and off also increases. What's more, in S. Manetti and A. Liberatore, "Switched-capacitor lowpass filter without active components," Electron. Lett., 1980, 16, pp. 883-885, a transfer function when the respective capacities of a single set of capacitors Ch1 and Ch2 used to transfer and receive an electric charge are different is not disclosed, and flexibility for mounting the LPF is therefore low.

To address this, the present invention provides an improved filter circuit that does not impair frequency characteristics of a charge domain second order IIR-LPF. Hereinafter, an exemplary embodiment of the present invention will be described with reference to the appended drawings.

2. LPF ACCORDING TO EMBODIMENT OF THE PRESENT INVENTION

2-1. Structure of LPF According to Embodiment of the Present Invention

FIG. 1 is an explanatory diagram showing the structure of a charge domain infinite impulse response low pass filter (IIR-LPF) 100 according to an embodiment of the present invention. Hereinafter, the structure of the charge domain IIR-LPF 100 (hereinafter also simply referred to as the "LPF 100") according to the embodiment of the present invention will be described with reference to FIG. 1.

As shown in FIG. 1, the LPF 100 according to the embodiment of the present invention includes a power source 101, a transconductance amplifier gm, and capacitors Ch1, Ch2, Cra and Crb.

The power source 101 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 1, a current with an amplitude proportional to the input voltage signal $V_{IN}$ from the power source 101, and charges the capacitor Ch1.

The capacitors Cra and Crb move alternately between an A point side and a B point side in synchronization with a clock input to the LPF 100. Because of the capacitors Cra and Crb moving alternately between the A point side and the B point side, an electric charge can be transferred and received between the capacitor Ch1 and the capacitor Ch2. As a result, the capacitor Ch2 is charged, a voltage is generated at the B point in FIG. 1, and it is possible to output an output voltage signal $V_{OUT}$.

Here, the regularity of movement of the capacitors Cra and Crb will be explained. When the capacitors Cra and Crb move from the A point side to the B point side in FIG. 1, the capacitors Cra and Crb move in parallel with each other while maintaining the same polarity. On the other hand, when the capacitors Cra and Crb move from the B point side to the A point side in FIG. 1, the capacitors Cra and Crb move while reversing the polarity.

In addition, the capacitors Cra and Crb are variable capacity elements which can change the capacity. When the capacitors Cra and Crb move from the A point side to the B point side in FIG. 1, the capacity is 1/k, and when capacitors Cra and Crb move from the B point side to the A point side in FIG. 1, the polarity is reversed and the capacity is k fold. This is a significant point of difference with the LPF 10 according to the related art shown in FIG. 10. In the following explanation, the capacitors Cra and Crb are described where the capacity is Cr on the A point side in FIG. 1, and the capacity is Cr/k on the B point side in FIG. 1.

2-2. Transfer Function of LPF According to Embodiment of the Present Invention The structure of the charge domain IIR-LPF 100 according to the embodiment of the present invention is described above with reference to FIG. 1. Next, the transfer function of the LPF 100 shown in FIG. 1 is calculated in the same manner as the transfer function of the LPF 10 according to the related art. With the LPF 10 according to the related art, for the ease of analysis, the capacity of the capacitors Ch1 and Ch2 was assumed to be equal, but this becomes a limiting condition on the circuit layout etc. when the LPF 10 is actually mounted on an IC. Therefore, while lessening this limiting condition to increase versatility, the transfer function of the LPF 100 shown in FIG. 1 is calculated when the capacity of the capacitors Ch1 and Ch2 is different.

First, when a difference equation is established relating to the electric charge of the A point and the B point in FIG. 1, the following Expression 3 and Expression 4 are obtained.

$$q_A(n) = q_A(n-1) - \frac{1}{N}q_A(n-1) - \frac{1}{M}q_b(n) + q_i(n) \quad \text{Expression 3}$$

$$q_B(n) = q_B(n-1) - \frac{1}{M}q_B(n-1) + \frac{1}{N}q_A(n-1) \quad \text{Expression 4}$$

When the above Expression 3 and Expression 4 are z transformed, the following Expression 5 and Expression 6 are respectively obtained.

$$Q_A(z) = \left(1 - \frac{1}{N}\right)Q_A(z)z^{-1} - \frac{1}{M}Q_B(z)z^{-1} + Q_i(z) \quad \text{Expression 5}$$

$$Q_B(z) = \left(1 - \frac{1}{M}\right)Q_B(z)z^{-1} + \frac{1}{N}Q_A(z)z^{-1} \quad \text{Expression 6}$$

When the transfer function of the electric charge of the LPF 100 shown in FIG. 1 is obtained from the above Expression 5 and Expression 6, the following Expression 7 is obtained.

$$\frac{Q_B(z)}{Q_i(z)} = \frac{z^{-1}/N}{1 - \left(2 - \frac{M+N}{M \cdot N}\right)z^{-1} - \left\{\frac{M+N-2}{M \cdot N} - 1\right\}z^{-2}} \quad \text{Expression 7}$$

If an approximate mapping from the z-space to the s-space is performed using bilinear transformation with respect to the above Expression 7, and the filter $\omega_P$ and $Q_P$ are respectively calculated, the following Expression 8 and Expression 9 are obtained.

$$\omega_P = \frac{2}{T_s\sqrt{2M \cdot N - M - N + 1}} \quad \text{Expression 8}$$

$$Q_P = \frac{\sqrt{2M \cdot N - M - N + 1}}{M + N - 2} \quad \text{Expression 9}$$

Taking into account the transconductance amplifier gm, the capacity of the capacitor on the B point side in FIG. 1 and the fact that sampling is performed in a rectangular time window, when the transfer function with respect to the electric charge of the LPF 100 is converted to the transfer function with respect to the voltage, the following Expression 10 is obtained.

$$\frac{V_{OUT}(f)}{V_{IN}(f)} = \quad \text{Expression 10}$$

$$\frac{Q_B(\exp(j \cdot 2\pi \cdot f \cdot T_s))}{Q_i(\exp(j \cdot 2\pi \cdot f \cdot T_s))} \cdot \frac{g_m \cdot T_s}{\left(Ch_2 + \frac{Cr}{k}\right)} \cdot \frac{\sin(\pi \cdot f \cdot T_s)}{\pi \cdot f \cdot T_s}$$

Here, the capacitor ratio of the capacitors Ch1 and Ch2 and the capacitors Cra and Crb, as shown in FIG. 1 also, is expressed by the relationships in the following Expression 11 and Expression 12.

$$Ch_1 = Cr(N - 1) \quad \text{Expression 11}$$

$$Ch_2 = \frac{1}{k}Cr(M - 1) \quad \text{Expression 12}$$

2-3. Frequency Characteristics of LPF According to Embodiment of the Present Invention Here, in order to match conditions with the explanation of the LPF 10 according to the related art, for the LPF 100 shown in FIG. 1, M=N=20, Ts=1.0 [ns], gm=1.0 [mS], Ch1=3.8 [pF], Cr=0.2 [pF] and k=4 are set. By positing k=4, when the capacitors Cra and Crb move from the A point side to the B point side shown in FIG. 1, the capacity of the capacitors Cra and Crb is ¼. Therefore, the capacity of the capacitor Cr2 is ¼ that of the capacity of the capacitor Cr2 of the LPF 10 shown in FIG. 10 (=0.95 [pF]). When the frequency characteristics of the LPF 100 are calculated from the above Expression 10, they are as shown in FIG. 2.

Figure 2:
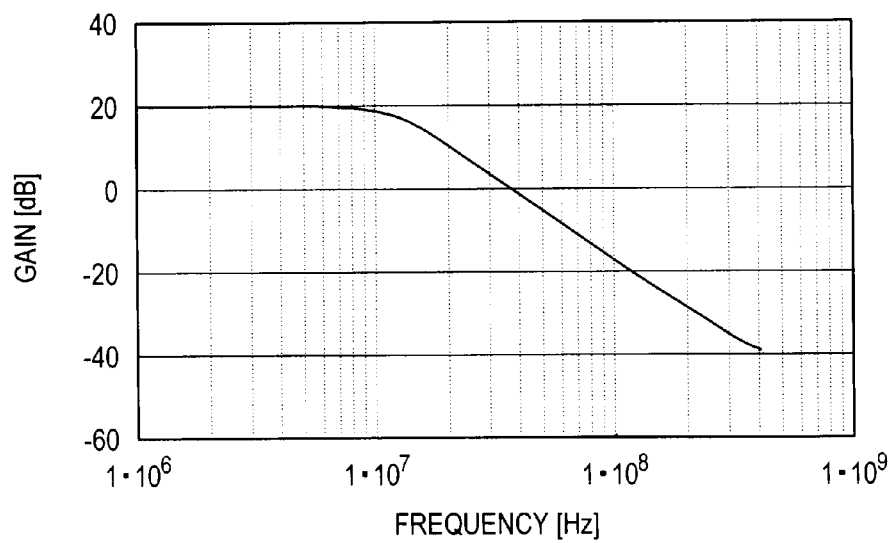
FIG. 2 is an explanatory diagram showing frequency characteristics of the LPF 100.

As shown in FIG. 2, under the above conditions, the frequency characteristics of the LPF 100 are flat to approximately 10 [MHz] in the lower frequency band, and the cut off frequency is approximately 11.5 [MHz]. It can be seen that in the higher frequency band the frequency characteristics have second order LPF characteristics that attenuate with an attenuation slope of −40 [dB/dec]. The frequency characteristics shown in FIG. 2 have generally the same shape as the frequency characteristics of the LPF 10 according to the related art shown in FIG. 12, but it can be seen that, compared with the frequency characteristics of the LPF 10 according to the related art, the gain has increased to 20.0 [dB] in the flat section.

Figure 3:
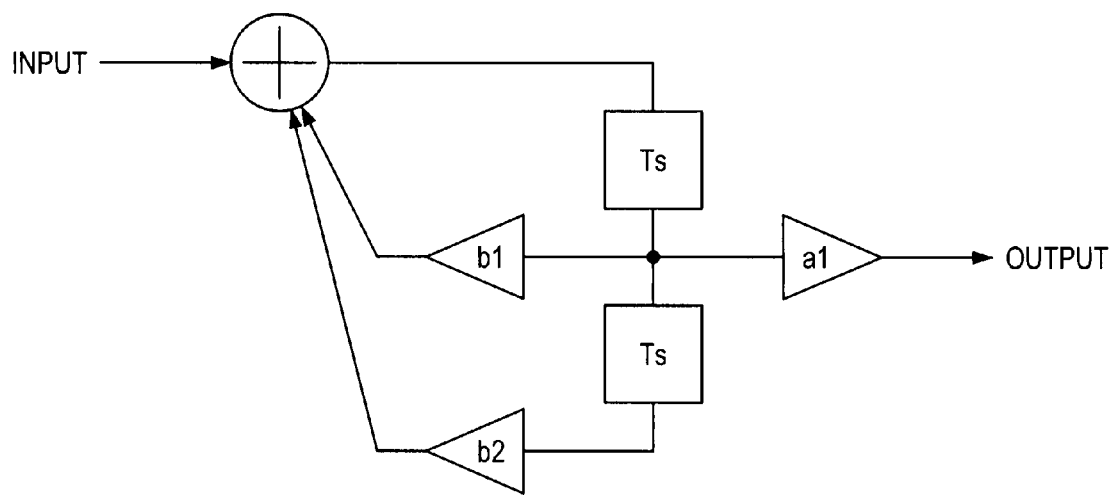
FIG. 3 is an explanatory diagram showing the structure of a digital filter of a second order IIR-LPF that is equivalent to a transfer function of an electric charge of the LPF 100.

This shows that there are no issues with regard to the stability of the LPF 100 according to the present embodiment. FIG. 3 is an explanatory diagram showing the structure of a digital filter of the second order IIR-LPF that is equivalent to the transfer function of the electric charge of the LPF 100 shown in the above Expression 7. The Ts of FIG. 3 is a delay of one clock time, and a1, b1 and b2 are gain elements shown in the following Expression 13 to Expression 15. a1 in Expression 13 is obtained by multiplying the coefficient of $z^{-1}$ in the numerator of Expression 7 by −1. b1 in Expression 14 is obtained by multiplying the coefficient of $z^{-1}$ in the denominator of Expression 7 by −1, and b2 in Expression 15 is obtained by multiplying the coefficient of $z^{-2}$ in the denominator of Expression 7 by −1.

$$a1 = \frac{1}{N} \quad \text{Expression 13}$$

$$b1 = 2 - \frac{M+N}{M \cdot N} \quad \text{Expression 14}$$

$$b2 = \frac{M+N-2}{M \cdot N} - 1 \quad \text{Expression 15}$$

Figure 4:
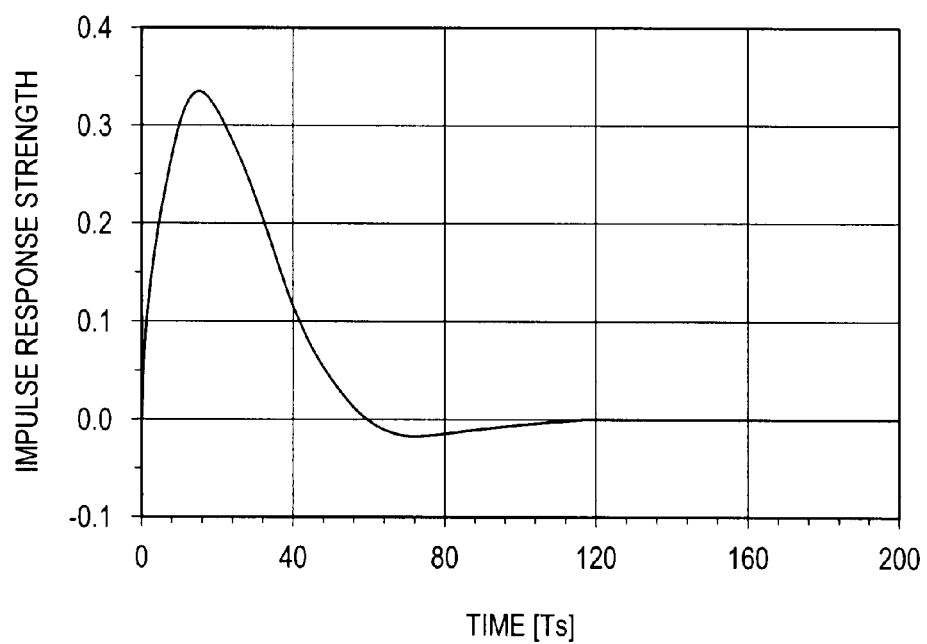
FIG. 4 is an explanatory diagram showing a state of an impulse response of the digital filter shown in FIG. 3.

With respect to the digital filter shown in FIG. 3, an impulse response when N=M=20 is shown in FIG. 4. In FIG. 4, the horizontal axis shows time, with a clock cycle Ts as the reference point. The vertical axis indicates a strength of the impulse response. As shown in FIG. 4, the impulse response of the digital filter shown in FIG. 3 does not diverge, and stability can be confirmed. As the poles of the digital filter shown in FIG. 3 are used within a range of a complex root, the following Expression 16 and Expression 17 that are obtained from b1 shown in Expression 14 and b2 shown in Expression 15 can be used for determination.

$$b2 < -\frac{b1^2}{4} \quad \text{Expression 16}$$

$$0 \leq b2 < 1 \quad \text{Expression 17}$$

Figure 5:
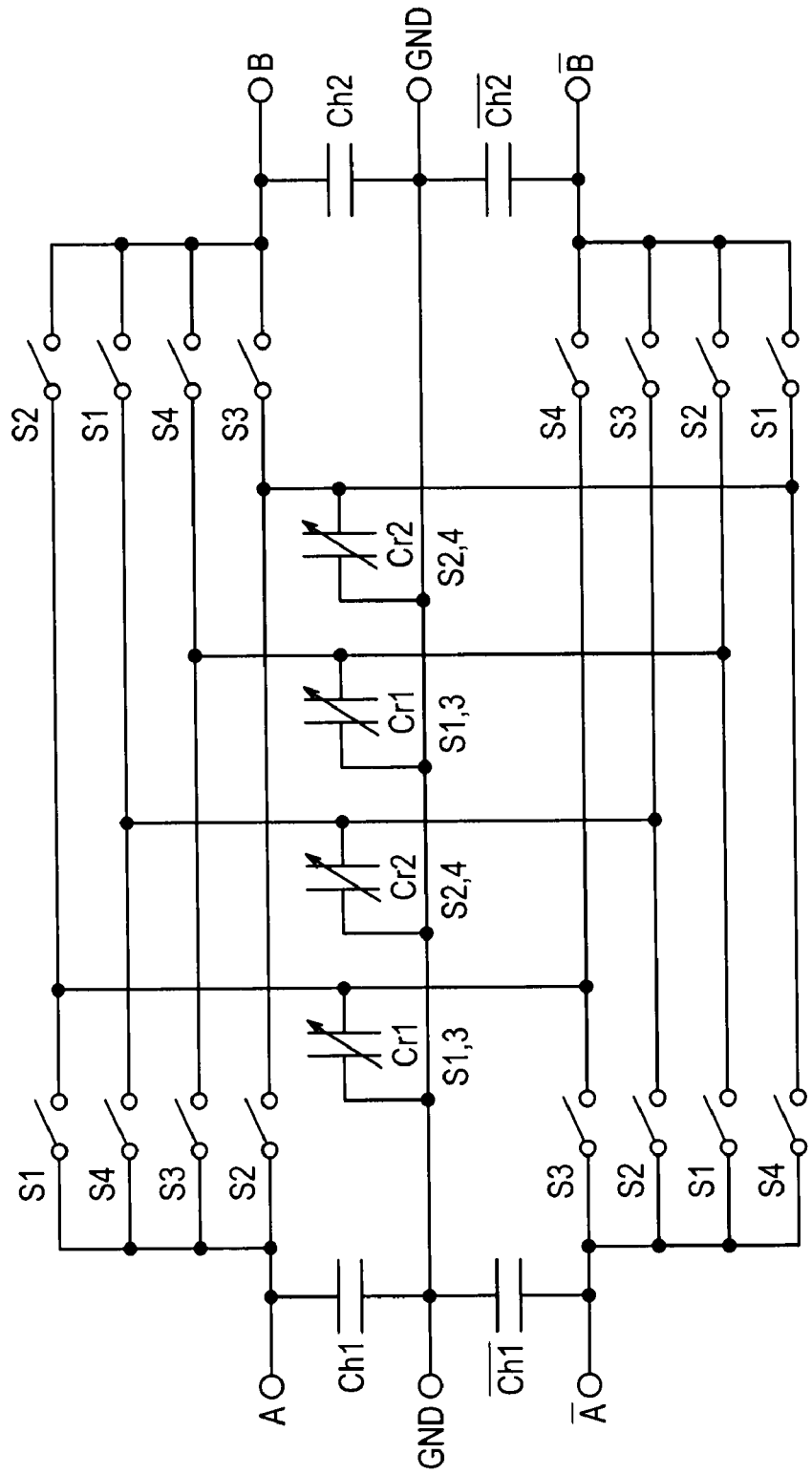
FIG. 5 is an explanatory diagram showing the circuit structure of a differential structure using variable capacity circuits in place of a flying capacitor method.
Figure 6:
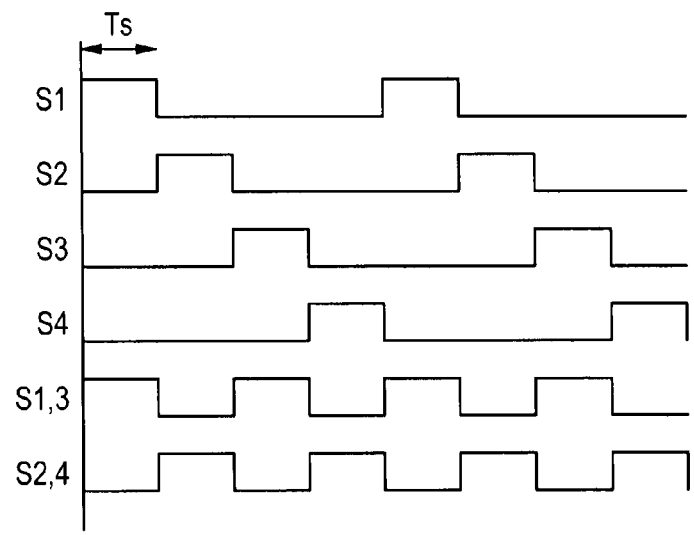
FIG. 6 is an explanatory diagram showing waveforms of clocks input to the circuit shown in FIG. 5.

2-4. Example of Circuit Structure of LPF According to Embodiment of the Present Invention FIG. 5 is an explanatory diagram showing the circuit structure of a differential structure using variable capacity circuits between the A point and the B point of the LPF 100 shown in FIG. 1, in place of the flying capacitor method. Further, FIG. 6 is an explanatory diagram showing waveforms of clocks input to the circuit shown in FIG. 5. Each of the clocks shown in FIG. 6 corresponds to each of the switches shown in FIG. 5. Each of the switches shown in FIG. 5 is turned on when each of clocks S1, S2, S3 and S4 shown in FIG. 6 is in a high level state and is turned off when each of the clocks shown in FIG. 6 is in a low level state. In addition, when the clocks S1, 3 and S2, 4 are in the high level state, the capacity of variable capacity circuits Cr1 and Cr2 is k fold the capacity of the low level state, and when the clocks are in the low level state, the capacity is 1/k the capacity of the high level state.

Figure 7:
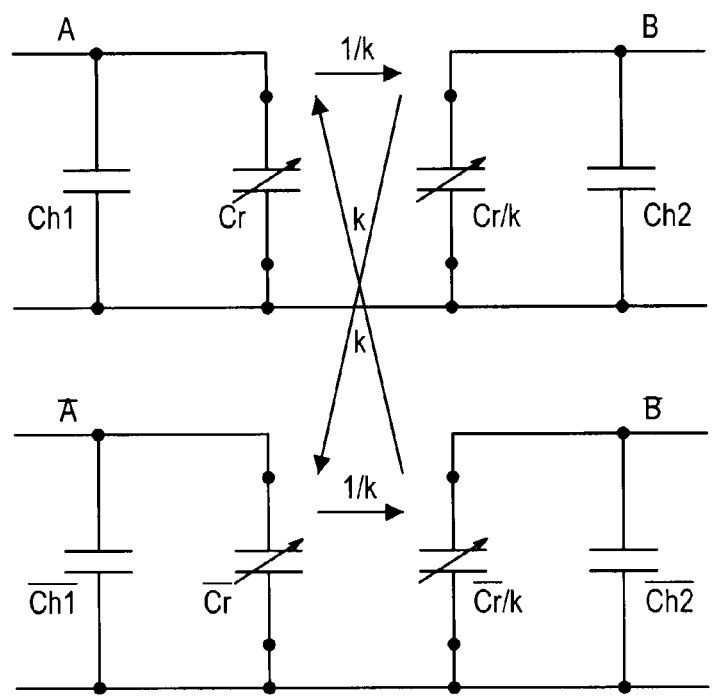
FIG. 7 is an explanatory diagram showing an operation overview of the circuit shown in FIG. 5.

An operation of the differential structure using variable capacity circuits shown in FIG. 5 will be explained. FIG. 7 is an explanatory diagram showing an operation overview of the circuit shown in FIG. 5. As shown in FIG. 7, when the capacitor Cr returns from the B point side to the A point side, instead of the polarity being reversed, as in the flying capacitor method, it has been made possible to move the capacitor Cr between a positive phase and a negative phase.

Figure 8:
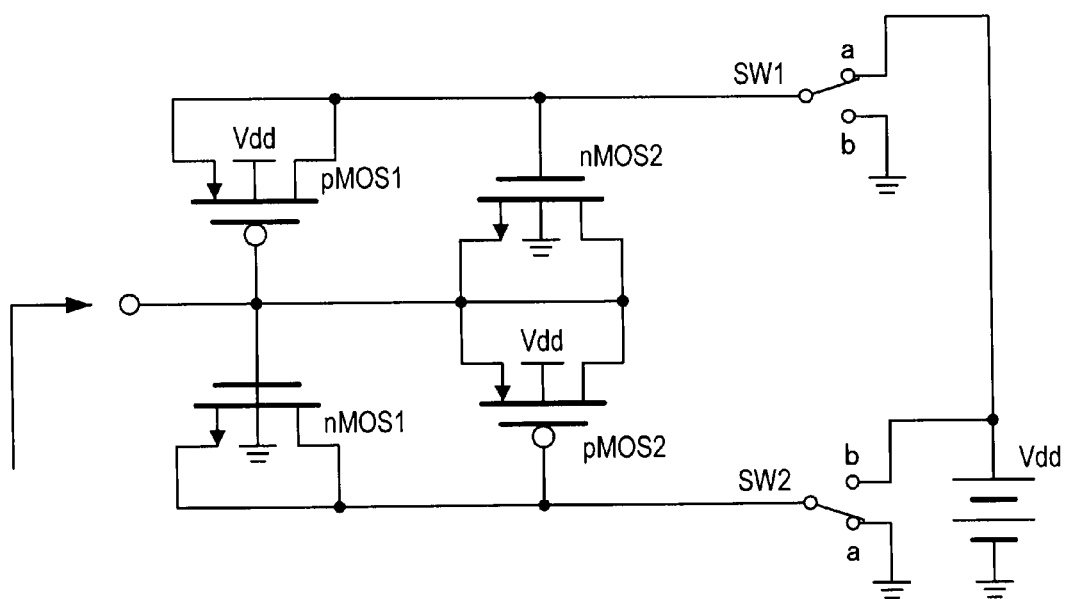
FIG. 8 is an explanatory diagram showing an example of the circuit structure of the variable capacity circuits Cr1 and Cr2 shown in FIG. 5.

FIG. 8 is an explanatory diagram showing an example of the circuit structure of the variable capacity circuits Cr1 and Cr2 shown in FIG. 5. When the capacity from the left side to the right side of FIG. 8 is measured, switches SW1 and SW2 have a large capacity, respectively, when they are located on an a point side. In contrast, when the switches SW1 and SW2 are located on a b point side, their respective capacity is small. Note that, the operation of the variable capacity circuit and the changes in capacity shown in FIG. 8 are disclosed in detail in A. Yoshizawa and S. Iida, "A Gain-Boosted Discrete-Time Charge-Domain FIR LPF with Double-Complementary MOS Parametric Amplifiers," Proc. IEEE Int. Solid State Circuits Conf. Dig. Tech. Papers, February 2008 and in Japanese Patent Application Publication No. JP-A-2008-99224.

3. COMMUNICATION DEVICE PROVIDED WITH LPF ACCORDING TO EMBODIMENT OF THE PRESENT INVENTION

Figure 9:
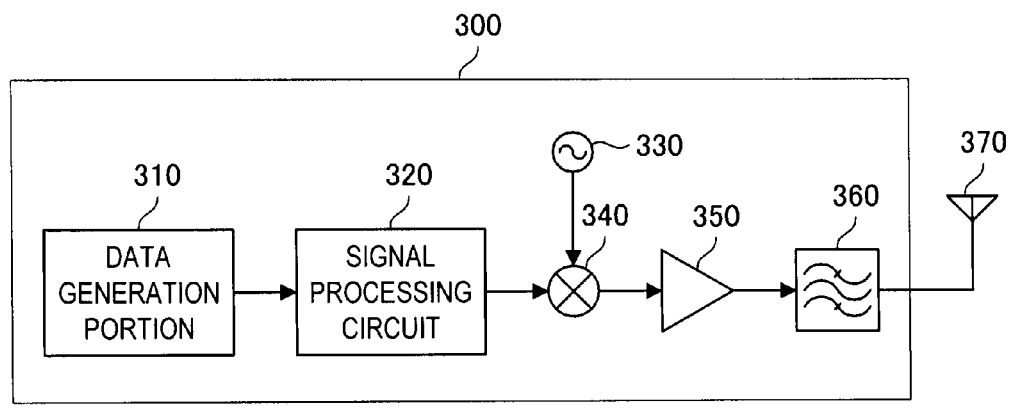
FIG. 9 is an explanatory diagram showing the structure of a communication device 300 provided with the LPF according to the embodiment of the present invention.

Next, the structure of a communication device provided with the LPF according to the embodiment of the present invention will be described. FIG. 9 is an explanatory diagram showing the structure of a communication device 300 provided with the LPF according to the embodiment of the present invention.

As shown in FIG. 9, the communication device 300 provided with the LPF according to the embodiment of the present invention includes a data generation portion 310, a signal processing circuit 320, a local signal generator 330, a frequency converter 340, a power amplifier 350, a band limiting filter 360 and an antenna 370.

Data to be transmitted from the communication device 300 is generated in the data generation portion 310 and is input to the signal processing circuit 320. In the signal processing circuit 320, processing such as D/A conversion, encoding and modulation is performed. Thus, a transmission signal in a base band or in an intermediate frequency (IF) band is generated. The transmission signal from the signal processing circuit 320 is input to the frequency converter (mixer) 340, and is multiplied by a local signal from the local signal generator 330. As a result of multiplication of the transmission signal by the local signal, the transmission signal is converted to a radio frequency (RF) band signal, namely, up-converted.

The RF signal that is obtained by up-conversion in the frequency converter 330 is amplified by the power amplifier 350, and is then input to the band limiting filter 360. After the RF signal is subjected to band limitation by the band limiting filter 360 and unnecessary frequency components are thereby removed, the resultant RF signal is supplied to the antenna 370. Note that various types of charge domain second order IIR-LPF circuits described above can be used as the band limiting filter 360.

4. CONCLUSION

As described above, according to the embodiment of the present invention, higher gain can be obtained in comparison to a charge domain second order IIR-LPF according to the related art, while having the same kind of frequency characteristics as the charge domain second order IIR-LPF according to the related art. In addition, in comparison to the charge domain second order IIR-LPF according to the related art, the capacity of the output side capacitor Ch2 can be made smaller and thus a mounting area can be reduced, leading to reductions in cost.

Moreover, as shown in FIG. 5, in place of the flying capacitor method used in the charge domain second order IIR-LPF according to the related art, a differential structure can be realized that uses variable capacity circuits. By using the differential structure using the variable capacity circuits, resistance to common mode noise in an IC can be improved. With the structure shown in FIG. 5, by switching to a capacitor on an opposite phase side, rather than reversing the polarity of the capacitor, the number of switches and the number of clocks required for operation can be reduced in comparison to the charge domain second order IIR-LPF according to the related art.

Moreover, with the embodiment of the present invention, a capacity of each of the input side capacitor Ch1 and the output side capacitor Ch2 can be set individually. As a result, the LPF 100 according to the embodiment of the present invention displays improved flexibility in terms of circuit design compared to the LPF 10 according to the related art.

It should be understood by those skilled in the art that various modifications, combinations, sub-combinations and alterations may occur depending on design requirements and other factors insofar as they are within the scope of the appended claims or the equivalents thereof.

The present invention can be applied to a filter circuit and to a communication device. It can be particularly applied to a filter circuit using a flying capacitor and to a communication device equipped with the filter circuit using the flying capacitor. At the same time, it can be applied to a filter circuit that uses a variable capacity circuit in place of the flying capacitor and to a communication device that is equipped with the filter circuit using the variable capacity circuit.

The present application contains subject matter related to that disclosed in Japanese Priority Patent Application JP 2008-326200 filed in the Japan Patent Office on 22 Dec. 2008, the entire content of which is hereby incorporated by reference.

What is claimed is:
1. A filter circuit comprising:
a flying capacitor which maintains polarity when switching from an input terminal to an output terminal, and the polarity of which is reversed when switching from the output terminal to the input terminal;
a first capacitor that is provided in parallel with the flying capacitor, at the input terminal of the flying capacitor; and
a second capacitor that is provided in parallel with the flying capacitor, at the output terminal of the flying capacitor, wherein the flying capacitor includes a variable capacity element such that the capacity becomes smaller when switching from the input terminal to the output terminal and becomes larger when switching from the output terminal to the input terminal.

2. The filter circuit according to claim 1, wherein the first capacitor and the second capacitor have a different capacity.

3. A communication device comprising:
a filter circuit, including:
   a flying capacitor which maintains polarity when switching from an input terminal to an output terminal, and the polarity of which is reversed when switching from the output terminal to the input terminal;
   a first capacitor that is provided in parallel with the flying capacitor, at the input terminal of the flying capacitor; and
   a second capacitor that is provided in parallel with the flying capacitor, at the output terminal of the flying capacitor,
wherein the flying capacitor includes a variable capacity element such that the capacity becomes smaller when switching from the input terminal to the output terminal and becomes larger when switching from the output terminal to the input terminal.

4. A filter circuit comprising:
at least one variable capacity circuit that has a larger capacity when connected with an input terminal than when connected with an output terminal and that has a smaller capacity when connected with the output terminal than when connected with the input terminal, the at least one variable capacity circuit maintaining polarity when switching from the input terminal to the output terminal, and reversing polarity when switching from the output terminal to the input terminal;
a first capacitor that is provided in parallel with the at least one variable capacity circuit, at the input terminal of the at least one variable capacity circuit; and
a second capacitor that is provided in parallel with the at least one variable capacity circuit, at the output terminal of the at least one variable capacity circuit.

5. The filter circuit according to claim 4, wherein the first capacitor and the second capacitor have a different capacity.

6. A communication device comprising:
a filter circuit including:
   at least one variable capacity circuit that has a larger capacity when connected with an input terminal than when connected with an output terminal and that has a smaller capacity when connected with the output terminal than when connected with the input terminal, the at least one variable capacity circuit maintaining polarity when switching from the input terminal to the output terminal, and reversing polarity when switching from the output terminal to the input terminal;
   a first capacitor that is provided in parallel with the at least one variable capacity circuit, at the input terminal of the at least one variable capacity circuit; and
   a second capacitor that is provided in parallel with the at least one variable capacity circuit, at the output terminal of the at least one variable capacity circuit.

* * * * *